US008143957B2

(12) United States Patent
Quan et al.

(10) Patent No.: US 8,143,957 B2
(45) Date of Patent: Mar. 27, 2012

(54) CURRENT-MODE GAIN-SPLITTING DUAL-PATH VCO

(75) Inventors: Xiaohong Quan, San Diego, CA (US); Marzio Pedrali-Noy, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 11/400,130

(22) Filed: Apr. 7, 2006

(65) Prior Publication Data

US 2007/0159262 A1    Jul. 12, 2007

Related U.S. Application Data

(60) Provisional application No. 60/758,468, filed on Jan. 11, 2006.

(51) Int. Cl.
*H03L 7/00* (2006.01)

(52) U.S. Cl. ........................................................ 331/16

(58) Field of Classification Search .................... 331/16, 331/34, 177 R, 175; 327/156; 455/260
See application file for complete search history.

(56) References Cited

U.S. PATENT DOCUMENTS

| | | | |
|---|---|---|---|
| 4,528,496 A * | 7/1985 | Naokawa et al. | 323/315 |
| 4,639,688 A * | 1/1987 | Hopwood et al. | 331/10 |
| 5,382,922 A | 1/1995 | Gersbach et al. | |
| 5,504,459 A | 4/1996 | Gersbach et al. | |
| 5,831,486 A | 11/1998 | Wehbi | |
| 6,150,887 A | 11/2000 | Yamaguchi | |
| 6,225,868 B1 * | 5/2001 | Kawaguchi | 331/34 |
| 6,433,626 B1 * | 8/2002 | Guimaraes | 327/552 |
| 6,560,448 B1 * | 5/2003 | Baldwin et al. | 455/234.1 |
| 6,563,388 B2 * | 5/2003 | Masenas et al. | 331/17 |
| 6,826,246 B1 | 11/2004 | Brown et al. | 375/376 |
| 7,177,611 B2 * | 2/2007 | Goldman | 455/260 |
| 7,268,631 B2 * | 9/2007 | Wilson | 331/16 |

(Continued)

FOREIGN PATENT DOCUMENTS

JP        4037219 A    2/1992

(Continued)

OTHER PUBLICATIONS

Wilson et al; "A CMOS Self-Calibrating Frequency Synthesizer" IEEE Journal of Solid-State Circuits, vol. 35, No. 10, Oct. 2000.

(Continued)

*Primary Examiner* — Robert Pascal
*Assistant Examiner* — Gerald Stevens
(74) *Attorney, Agent, or Firm* — Howard H. Seo; William M. Hooks

(57) ABSTRACT

Techniques to effectively handle large voltage-controlled oscillator (VCO) gain are described. The techniques utilize (1) a slow high-gain path to provide an average control current that adjusts the center frequency of a VCO and (2) a fast low-gain path to provide an instantaneous control current that adjusts the VCO frequency during normal operation. In one design, the VCO includes a voltage-to-current converter, a current amplifier, a summer, and a current-controlled oscillator (ICO). The voltage-to-current converter receives a control voltage and generates a first current and a second current. The current amplifier amplifies and filters the first current and generates a third current. The summer sums the second current and the third current and generates a control current. The ICO receives the control current and generates an oscillator signal having a frequency determined by the control current.

25 Claims, 6 Drawing Sheets

U.S. PATENT DOCUMENTS

| | | | |
|---|---|---|---|
| 7,659,782 B2 * | 2/2010 | Cong | 331/16 |
| 2004/0051591 A1 * | 3/2004 | Okada | 331/16 |
| 2005/0052208 A1 * | 3/2005 | Starr | 327/156 |
| 2005/0184772 A1 * | 8/2005 | Wilson et al. | 327/156 |
| 2006/0226916 A1 * | 10/2006 | Florescu et al. | 331/16 |
| 2006/0238261 A1 * | 10/2006 | Rhee et al. | 331/16 |

FOREIGN PATENT DOCUMENTS

| | | |
|---|---|---|
| JP | 11168378 A | 6/1999 |
| JP | 2003229764 A | 8/2003 |
| TW | 200404408 | 3/2004 |
| TW | I221705 | 10/2004 |
| TW | I232023 | 5/2005 |
| WO | 98/13939 A1 | 4/1998 |

OTHER PUBLICATIONS

International Search Report and Written Opinion—PCT/US2007/060418, International Search Authority—European Patent Office—Jun. 8, 2007.

* cited by examiner

CURRENT-MODE GAIN-SPLITTING DUAL-PATH VCO

CLAIM OF PRIORITY UNDER 35 U.S.C. §119

The present Application for Patent claims priority to Provisional Application No. 60/758,468 entitled "A dual-path method of reducing Voltage Controlled Oscllilator (VCO) gain Kvco while centering VCO frequency for ultra low supply voltage Phase Locked Loop application." filed Jan. 11, 2006, and assigned to the assignee hereof and hereby expressly incorporated by reference herein.

BACKGROUND

I. Field

The present disclosure relates generally to electronics circuits, and more specifically to oscillator and phase-locked loop (PLL).

II. Background

Oscillators and phase-locked loops are integral parts of many electronics circuits and are particularly important in communication circuits. For example, digital systems use clock signals to trigger synchronous circuits (e.g., flip-flops). Transmitter and receiver systems use local oscillator (LO) signals for frequency upconversion and downconversion, respectively. Wireless devices (e.g., cellular phones) in wireless communication systems typically use clock signals for digital circuitry and LO signals for transmitter and receiver systems. The clock and LO signals are generated with oscillators and their frequencies are often controlled with phase-locked loops.

A voltage-controlled oscillator (VCO) is an oscillator having an oscillation frequency that may be varied with a control voltage. A VCO may be designed with the capability to vary its oscillation frequency over a wide range. This wide tuning range may be required to (1) ensure that the VCO can operate at a required frequency or a required range of frequencies and (2) compensate for changes in the oscillation frequency due to component tolerances, integrated circuit (IC) process variations, temperature, voltage supply variations, and so on.

A large VCO gain is typically needed to achieve a wide tuning range. The VCO gain is roughly equal to the tuning range of the VCO divided by the control voltage range for the VCO. A large VCO gain may cause various adverse effects. First, if the VCO is used in a PLL, then the large VCO gain typically results in a wide loop filter bandwidth, which may compromise loop stability. In order to keep the loop filter bandwidth fixed and avoid instability, either a small charge pump current and/or a large loop filter capacitor may be used in the PLL. This results in a reduced signal-to-noise ratio for the charge pump and an area penalty for the large on-chip capacitor. Second, the large VCO gain results in the noise from circuit blocks (e.g., charge pump and loop filter) within the PLL being amplified by a large gain, which results in more jitter at the VCO output. All of these adverse effects are undesirable. The issues related to large VCO gain are more pronounced in low voltage applications since the control voltage range is more limited.

There is therefore a need in the art for techniques to effectively handle large VCO gain and achieve good performance.

SUMMARY

Techniques for effectively handling large VCO gain using current-mode dual paths are described herein. The techniques utilize (1) a slow high-gain path to provide an average control current that adjusts the center frequency of the VCO and (2) a fast low-gain path to provide an instantaneous or fast control current that adjusts the VCO frequency during normal operation. The high-gain path is associated with a large VCO gain but is slow and hence does not affect the PLL loop dynamics. The low-gain path is associated with a smaller VCO gain, is involved during normal operation, and affects the PLL loop dynamics. The VCO thus has a dual-path VCO gain that is essentially composed of two VCO gains, which are applicable at low and high frequencies.

In an embodiment, the VCO includes a voltage-to-current converter, a current amplifier, a summer, and a current-controlled oscillator (ICO). The voltage-to-current converter receives a control voltage and generates a first current and a second current. The current amplifier amplifies and filters the first current and generates a third current. The summer sums the second current and the third current and generates a control current. The ICO receives the control current and generates an oscillator signal having a frequency that is determined by the control current. The voltage-to-current converter, the current amplifier, and the summer may be efficiently implemented, e.g., with field effect transistors (FETs).

In an embodiment, a PLL includes the VCO described above, a divider, a phase-frequency detector, and a loop filter. The divider divides the oscillator signal in frequency and provides a feedback signal. The phase-frequency detector compares the phases of the feedback signal and a reference signal and provides a detector signal. The loop filter filters the detector signal and provides the control voltage. The PLL loop characteristics may be designed based on the smaller VCO gain provided by the fast low-gain path.

Various aspects and embodiments of the invention are described in further detail below.

BRIEF DESCRIPTION OF THE DRAWINGS

The features and nature of the present invention will become more apparent from the detailed description set forth below when taken in conjunction with the drawings in which like reference characters identify correspondingly throughout.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

Figure 1:
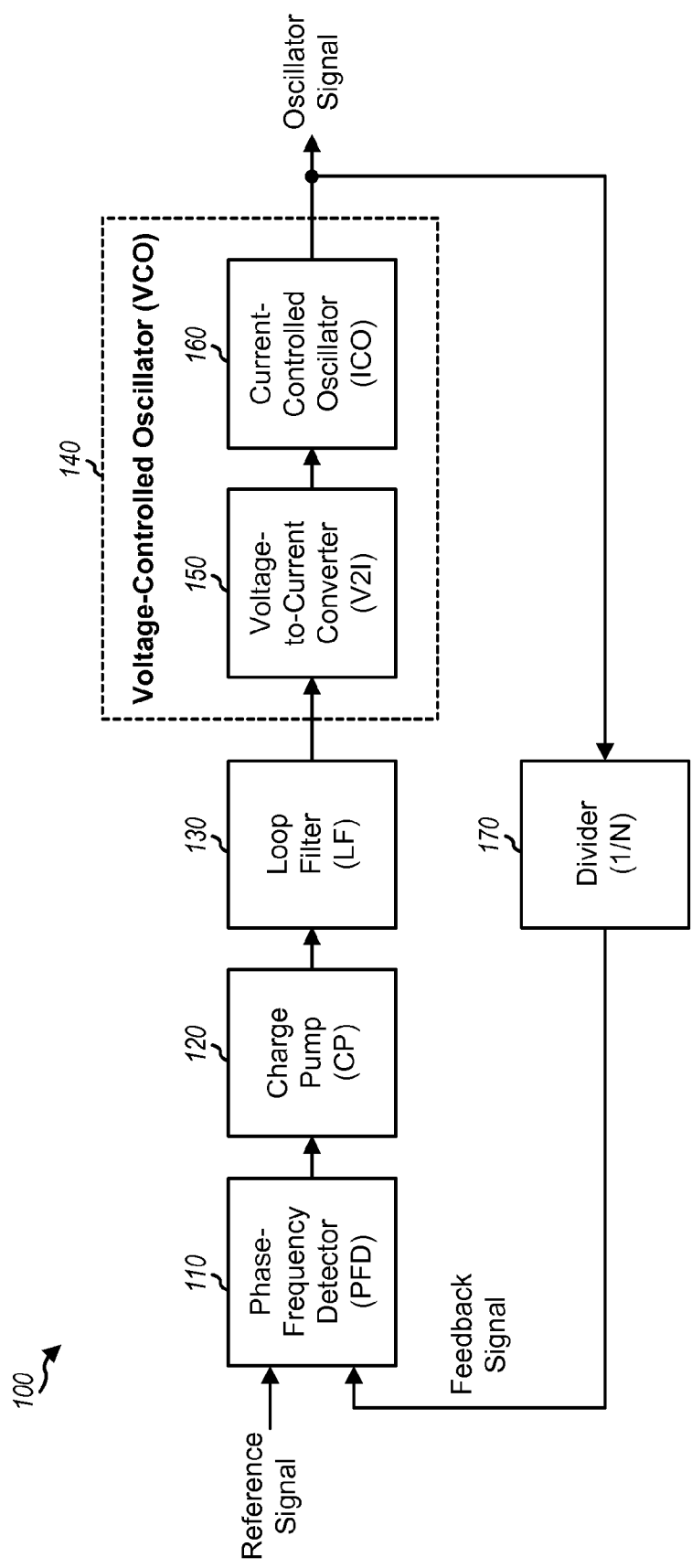
FIG. 1 shows a classical PLL.

FIG. 1 shows a block diagram of a classical PLL 100 that includes a phase-frequency detector (PFD) 110, a charge pump (CP) 120, a loop filter (LF) 130, a voltage-controlled oscillator (VCO) 140, and a divider 170. VCO 140 includes a voltage-to-current converter (V2I) 150 and a current-controlled oscillator (ICO) 160.

ICO 160 generates an oscillator signal having a frequency that is determined by a control current from converter 150. Divider 170 divides the oscillator signal by a factor of N in frequency, where N≧1, and provides a feedback signal. Phase-frequency detector 110 receives a reference signal and the feedback signal, compares the phases of the two signals, and provides a detector signal that indicates the phase difference/error between the two signals. Charge pump 120 generates an error signal that is proportional to the detected phase error. Loop filter 130 filters the error signal and provides a control voltage for VCO 140. Loop filter 130 adjusts the control voltage such that the phase or frequency of the feedback signal is locked to the phase or frequency of the reference signal. Converter 150 converts the control voltage to the control current for ICO 160.

VCO 140 may have a wide tuning range, and the VCO gain may be large. Various designs may be used to handle the large VCO gain. In one conventional design, digital calibration is performed to center the VCO frequency. In this design, a reference voltage is applied to the VCO and converted to a reference current. A calibration current is generated with a digital-to-analog converter (DAC) and summed with the reference current to generate the control current for the ICO. The reference voltage represents the nominal (or center) control voltage for the VCO. The calibration current is selected such that the ICO operates close to a desired frequency with the reference voltage applied. In effect, the calibration current provides an offset that centers the frequency of the ICO. This then allows a smaller gain to be used for the voltage-to-current converter, which reduces the VCO gain during normal operation. This design uses additional circuitry such as an accurate (e.g., bandgap) voltage reference, a DAC, and digital calibration circuits. Furthermore, if calibration is performed only once at power up, then the calibrated frequency may drift due to changes in the operating environmental, such as temperature and supply voltage variations.

In another conventional design, two control voltages are generated for the VCO. In this design, a low gain control voltage from the loop filter is compared against a reference voltage, and the resultant error voltage is integrated to obtain a high gain control voltage. The reference voltage represents the nominal control voltage for the VCO. The high gain control voltage is used to move the ICO to the desired frequency. In effect, the high gain control voltage provides an offset that centers the frequency of the VCO. This then allows a smaller gain to be used for the low gain control voltage, which reduces the VCO gain during normal operation. This design also uses additional circuitry such as an accurate (e.g., bandgap) voltage reference and an operational amplifier to implement the integrator. Furthermore, the bandwidth of the path for the low gain control voltage needs to be designed carefully in order to ensure loop stability and avoid disturbing the PLL loop dynamics.

Novel techniques for effectively handling large VCO gain are described herein. The techniques can provide good performance while avoiding the shortcomings of the conventional designs described above. The techniques handle the large VCO gain by utilizing two paths: a fast low-gain path in parallel with a slow high-gain path. The high-gain path provides an average control current that adjusts the center frequency of the VCO. The low-gain path provides an instantaneous or fast control current that adjusts the VCO frequency during normal operation. The high-gain path is associated with a large VCO gain but is slow and hence does not affect the PLL loop dynamics. The low-gain path is associated with a smaller VCO gain, is involved during normal operation, and affects the PLL loop dynamics.

Figure 2:
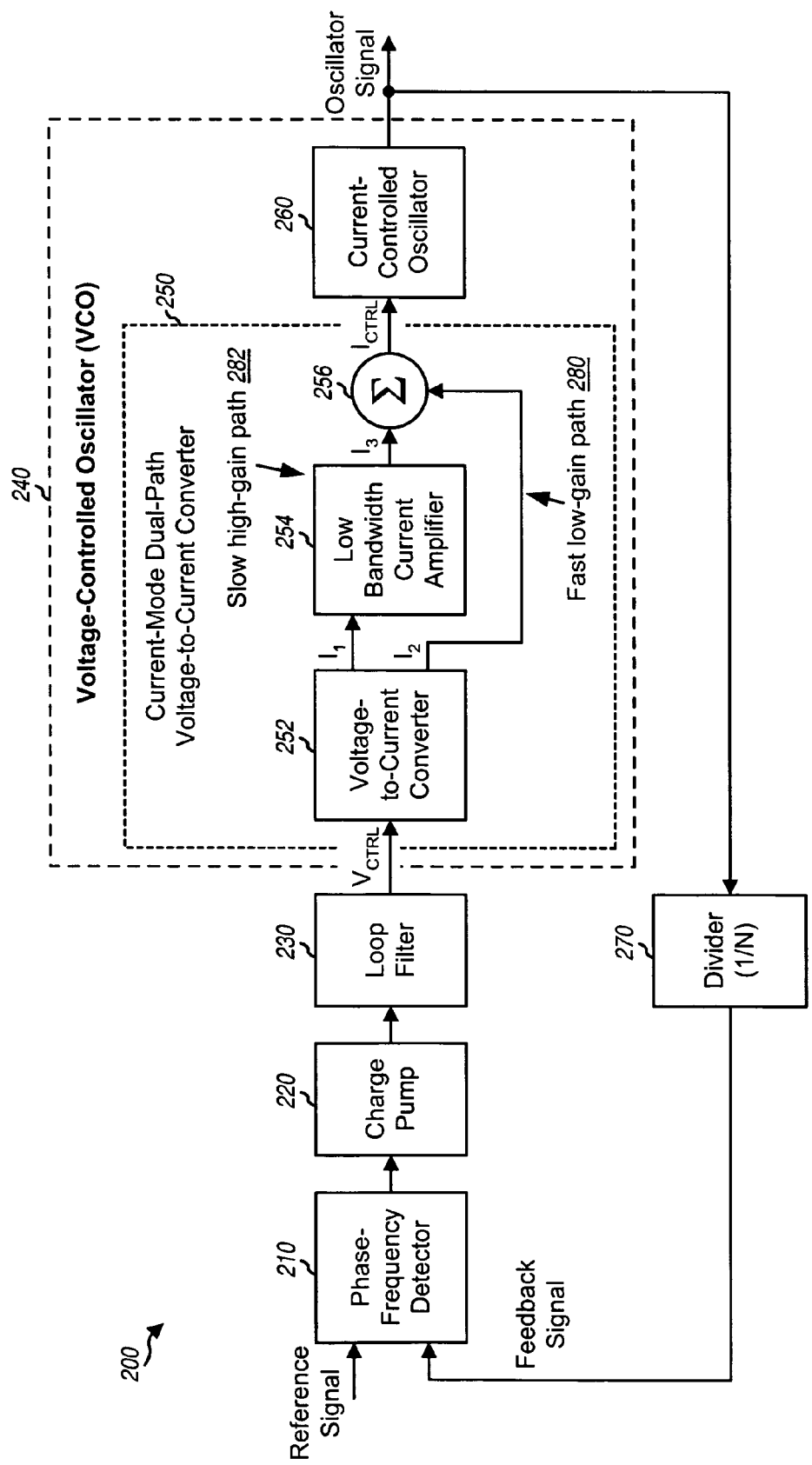
FIG. 2 shows a novel PLL that can effectively handle large VCO gain.

FIG. 2 shows a block diagram of an embodiment of a novel PLL 200 that can effectively handle large VCO gain. PLL 200 includes a phase-frequency detector 210, a charge pump 220, a loop filter 230, a voltage-controlled oscillator 240, and a divider 270. VCO 240 includes a current-mode dual-path voltage-to-current converter 250 and a current-controlled oscillator 260.

Phase-frequency detector 210, charge pump 220, loop filter 230, and ICO 260 operate as described above for phase-frequency detector 110, charge pump 120, loop filter 130, and ICO 160, respectively, in FIG. 1. Phase-frequency detector 210, charge pump 220, and loop filter 230 may be implemented with any design known in the art. For example, phase-frequency detector 210 may be an early-late detector that determines whether the feedback signal is early or late with respect to the reference signal. Loop filter 230 may be a first order loop filter or some other loop filter. ICO 260 may be implemented with various oscillator designs (e.g., a Colpitts oscillator, a ring oscillator, a delay line oscillator, and so on) and may be implemented with digital circuitry, or analog circuitry, or both types of circuitry. ICO 260 may also be designed to operate at any frequency such as radio frequency (RF), intermediate frequency (IF), and so on. The design of ICO 260 may be dependent on the application in which the ICO is used. For example, ICO 260 may be an oscillator that generates clock signals for digital circuitry. ICO 260 may also be an RF oscillator that generates an LO signal used for frequency downconversion and/or upconversion.

In the embodiment shown in FIG. 2, converter 250 includes a voltage-to-current converter 252, a low bandwidth current amplifier 254, and a summer 256. Voltage-to-current converter 252 receives a control voltage $V_{CTRL}$ from loop filter 230 and generates a first current $I_1$ and a second current $I_2$. In general, the first current $I_1$ may be equal to, greater than, or less than the second current $I_2$. Current amplifier 254 amplifies the first current $I_1$ with a gain of m, filters the amplified current, and provides a third current $I_3$. Current amplifier 254 has low bandwidth and does not affect the PLL loop dynamics during normal operation. Summer 256 sums the second current $I_2$ with the third current $I_3$ and provides the control current $I_{CTRL}$ for ICO 260.

In the embodiment shown in FIG. 2, converter 250 has two paths: a fast low-gain path 280 and a slow high-gain path 282. In this embodiment, fast low-gain path 280 has a gain of one and no filtering, and slow high-gain path 282 has a gain of m and filtering provided by low bandwidth current amplifier 254. The VCO gain is thus split into two paths. Path 280 corresponds to a small VCO gain path that adjusts the instantaneous frequency of the VCO during normal operation. Path 282 corresponds to a high VCO gain path that slowly adjusts the center frequency of the VCO. The VCO gain splitting is done after the voltage-to-current conversion. This allows for efficient implementation of converter 250 and may provide other benefits, as described below.

Figure 3:
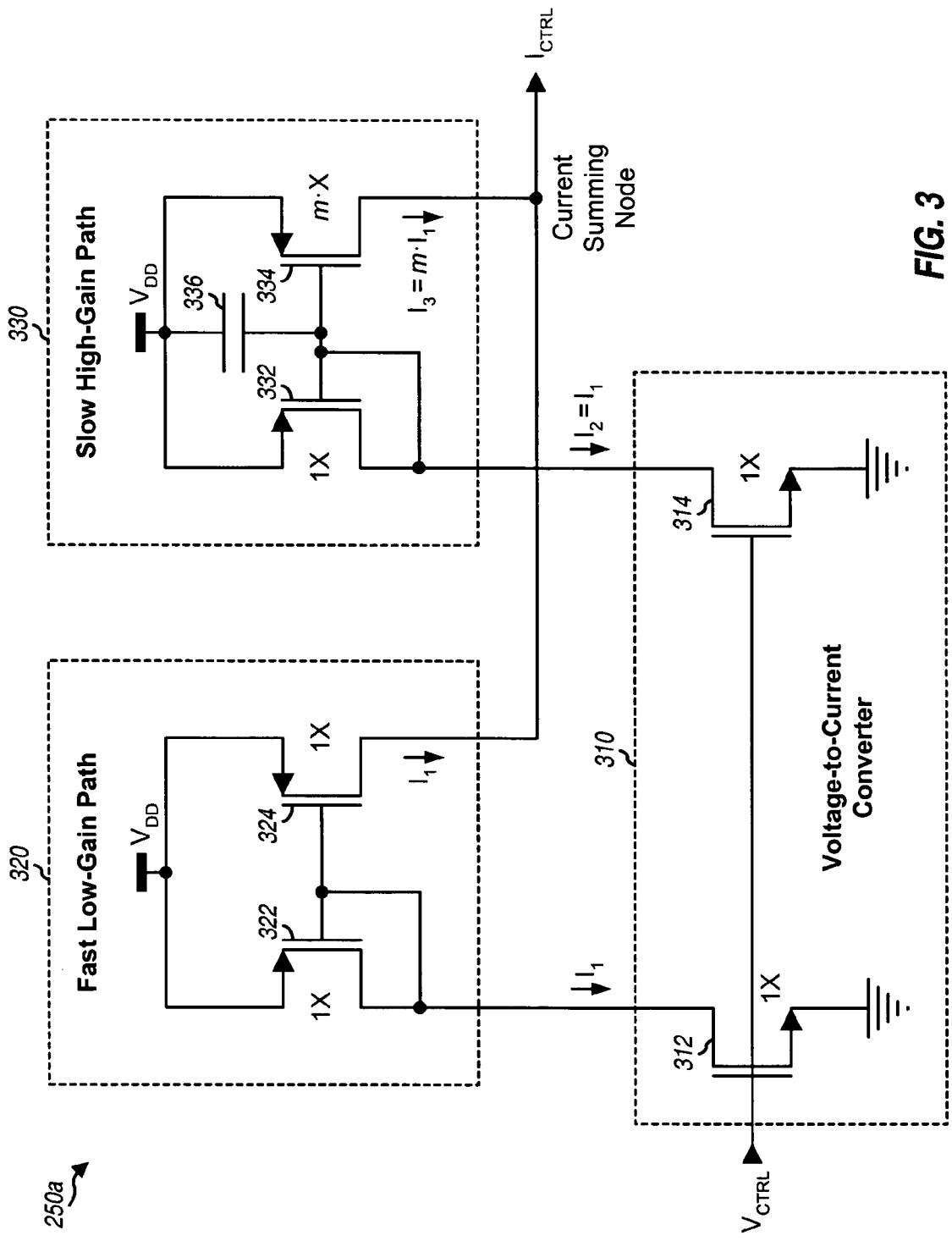
FIG. 3 shows a current-mode dual-path voltage-to-current converter.

FIG. 3 shows a schematic diagram of a current-mode dual-path voltage-to-current converter 250a, which is an embodiment of converter 250 in FIG. 2. In this embodiment, converter 250a includes a voltage-to-current converter 310, a fast low-gain current mirror 320, and a slow high-gain current mirror 330. Converter 250a is implemented in complementary metal oxide semiconductor (CMOS) with both N-channel field effect transistors (N-FETs) and P-channel FETs (P-FETs).

Voltage-to-current converter 310 includes N-FETs 312 and 314 that are coupled in parallel and have their sources coupled to circuit ground. The gates of N-FETs 312 and 314 are coupled together and receive the control voltage $V_{CTRL}$ from loop filter 230 in FIG. 2.

Fast low-gain current mirror 320 includes P-FETs 322 and 324 that are coupled as a current mirror. P-FET 322 has its source coupled to a power supply voltage $V_{DD}$, its gate coupled to its drain, and its drain coupled to the drain of N-FET 312. P-FET 324 has its source coupled to the supply voltage, its gate coupled to the gate of P-FET 322, and its drain coupled to a current summing node.

Slow high-gain current mirror 330 includes P-FETs 332 and 334 that are coupled as a current mirror. P-FET 332 has its source coupled to the supply voltage, its gate coupled to its drain, and its drain coupled to the drain of N-FET 314. P-FET 334 has its source coupled to the supply voltage, its gate coupled to the gate of P-FET 332, and its drain coupled to the current summing node. A capacitor 326 has one end coupled to the gates of P-FETs 332 and 334 and the other end coupled to the supply voltage. The current summing node provides the control current $I_{CTRL}$ for the ICO.

For voltage-to-current converter 310, N-FETs 312 and 314 receive the control voltage $V_{CTRL}$ and generate drain currents of $I_1$ and $I_2$, respectively. The transfer function between the drain current and the control voltage is determined by the characteristics of N-FETs 312 and 314. $I_1$ is equal to $I_2$ if N-FETs 312 and 314 have the same dimension of 1X and the same gate-to-source voltage $V_{GS}$, as shown in FIG. 3.

For current mirror 320, the drain current of P-FET 322 is equal to the drain current of N-FET 312. The drain current of P-FET 324 is equal to the drain current of P-FET 322 since P-FETs 322 and 324 have the same dimension of 1X and the same $V_{GS}$ voltage. Hence, P-FET 324 provides a drain current of $I_1$ to the current summing node. Current mirror 320 does not include any reactive element (besides parasitics) and is thus fast.

For current mirror 330, the drain current of P-FET 332 is equal to the drain current of N-FET 314. The drain current of P-FET 334 is m times the drain current of P-FET 332 since both P-FETs have the same $V_{GS}$ voltage and P-FET 334 has a dimension of m·X whereas P-FET 332 has a dimension of 1X. P-FET 334 provides a drain current of $I_3 = m \cdot I_1$ to the current summing node. Current mirror 330 includes capacitor 326 that prevents fast changes to the voltage at the gates of P-FETs 332 and 334. Thus, the drain current $I_3$ changes at a slow rate determined by the size of capacitor 326 and other factors.

FIG. 3 shows an efficient implementation of current-mode dual-path voltage-to-current converter 250a using a small number of FETs and one capacitor. The voltage-to-current conversion is performed with two N-FETs 312 and 314. The fast low-gain path is implemented with a first current mirror composed of two P-FETs 322 and 324. The slow high-gain path is implemented with a second current mirror composed of two P-FETs 332 and 334 and one capacitor 326. The second current mirror provides current multiplication with a fixed gain of m. The current summing node conveniently sums the drain currents of P-FETs 324 and 334 and provides the control current.

FIG. 3 shows one embodiment of current-mode dual-path voltage-to-current converter 250 that is implemented in CMOS. In general, converter 250 may be implemented with various designs. The voltage-to-current conversion, amplification, filtering, and summing functions may be explicitly performed with circuits or may be implicitly performed. For example, current summing may be achieved by connecting circuit outputs together. Multiple functions may also be combined within a given circuit. For example, the two current mirrors may be combined, and the first and second currents may not be explicitly generated.

Figure 4A:
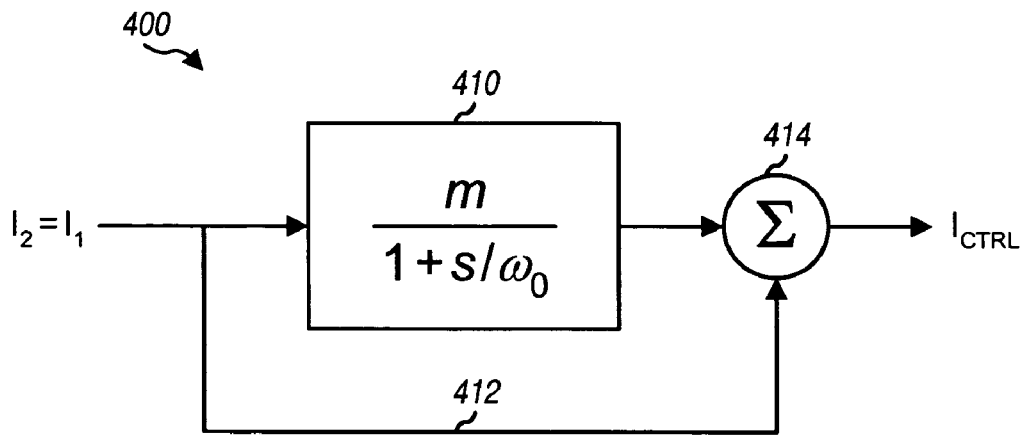
FIG. 4A shows an s-domain model of the converter in FIG. 3.

FIG. 4A shows a block diagram of an s-domain model 400 of current-mode dual-path voltage-to-current converter 250. In model 400, slow high-gain path 282 in FIG. 2 is represented by a block 410 having the transfer function shown in FIG. 4A. Fast low-gain path 280 is represented by a line 412. Summer 256 is represented by a summer 414.

The dual-path VCO gain for current-mode dual-path voltage-to-current converter 250 may be expressed as:

$$K'_{vco} = K_{vco} \cdot \frac{(m+1) \cdot \left(1 + \frac{s}{(m+1) \cdot \omega_0}\right)}{1 + \frac{s}{\omega_0}}, \quad \text{Eq (1)}$$

where $\omega_0$ is the bandwidth of current amplifier 254 in FIG. 2, $K_{vco}$ is the VCO gain with just the fast low-gain path, and $K'_{vco}$ is the VCO gain with both the slow high-gain path and the fast low-gain path. $K'_{vco}$ is the dual-path VCO gain that is applicable across all frequencies. $K_{vco}$ is the VCO gain that is applicable at higher frequencies and affects the PLL loop dynamics.

The bandwidth $\omega_0$ of current amplifier 254 is determined by the size of capacitor 336 and the transconductance of P-FET 332 in FIG. 3. A suitable capacitance value may be selected to achieve the desired bandwidth. The gain m may be selected based on various factors such as the desired performance, circuit implementation, and so on. If m is too small, then the benefits of the dual-path VCO gain may be minimal. Conversely, if m is too large, then the zero location at $(m+1) \cdot \omega_0$ may be too high, which may impact PLL loop stability. In an embodiment, a value of eight is used for m. Other values may also be used for m.

Figure 4B:
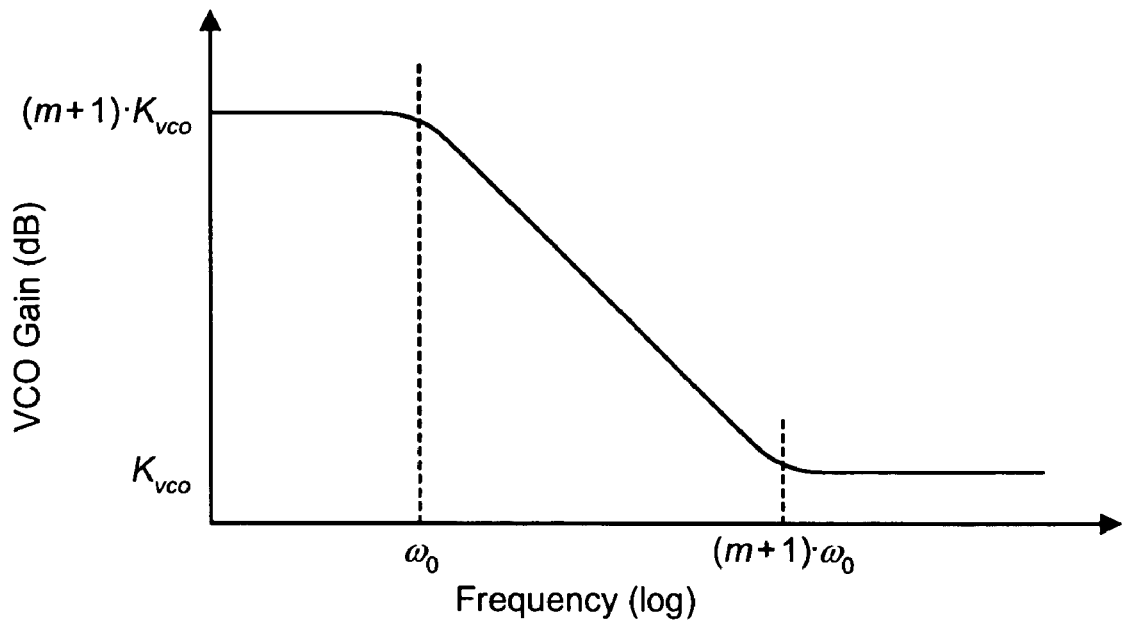
FIG. 4B shows a plot of the dual-path VCO gain.

FIG. 4B shows a plot of the dual-path VCO gain in equation (1). As shown in FIG. 4B and equation (1), the addition of current amplifier 254 adds one pole and one zero to the PLL loop gain, which is the total gain around the PLL. The pole is located at $\omega_0$, and the zero is located at $(m+1) \cdot \omega_0$. At low frequency (e.g., $s \rightarrow 0$), the VCO gain may be approximated as $(m+1) \cdot K_{vco}$. This large VCO gain is used to generate the average control current for the ICO. At high frequency, the VCO gain may be approximated as $K_{vco}$. This smaller VCO gain is used in near-lock condition and helps to reduce jitter. PLL loop stability may be ensured by designing $(m+1) \cdot \omega_0$ to be much less than the PLL loop gain bandwidth and preferably below the zero of loop filter 230.

Figure 5:
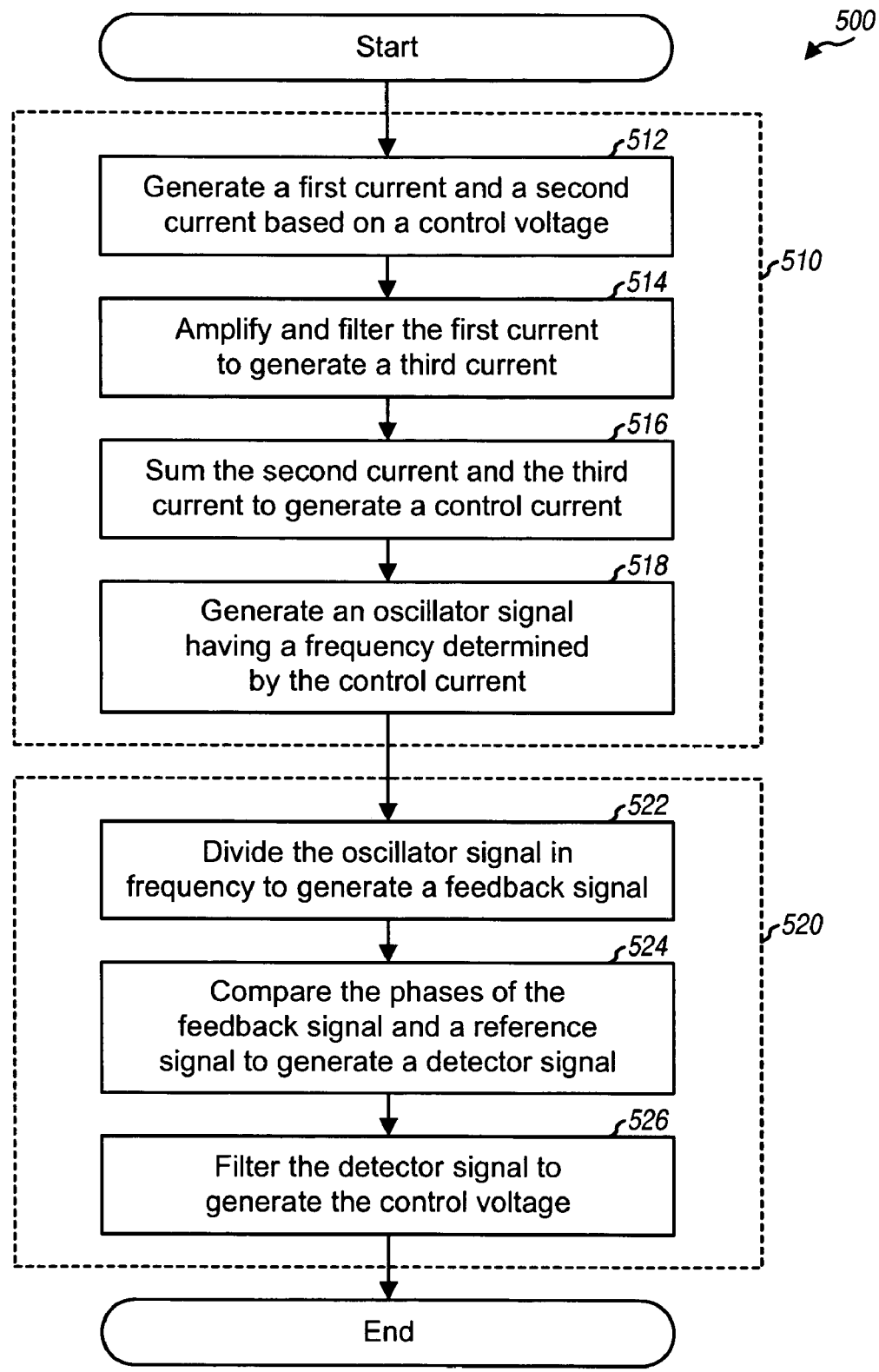
FIG. 5 shows operation of a PLL having a VCO with dual-path VCO gain.

FIG. 5 shows an embodiment of a process 500 for operating a PLL having a VCO with dual-path VCO gain. Block 510 shows operation of the VCO, and block 520 shows operation of the remaining PLL.

For the VCO in block 510, a first current and a second current are generated based on a control voltage (block 512). The first current is amplified and filtered to generate a third current (block 514). The second current and the third current are summed to generate a control current (block 516). An oscillator signal is generated having a frequency that is determined by the control current (block 518). Blocks 512, 514 and 516 may be performed by converter 250 in FIG. 2. Block 518 may be performed by ICO 260.

For the remaining PLL in block 520, the oscillator signal is divided in frequency to generate a feedback signal (block 522). The phases of the feedback signal and a reference signal are compared to generate a detector signal (block 524). The detector signal is filtered with a loop filter to generate the control voltage (block 526). Bock 522, 524 and 526 may be performed by divider 270, phase-frequency detector 210, and loop filter 230, respectively, in FIG. 2. Charge pump 220 may considered as part of phase-frequency detector 210.

The techniques described herein address the wide tuning range and large VCO gain issues by splitting the VCO gain into a slow high-gain path and a fast low-gain path after the voltage-to-current conversion of the control voltage. Wide tuning range is supported with the slow high-gain path that provides the average control current for the VCO. The fast low-gain path provides the smaller VCO gain that is used in near-lock condition. The smaller VCO gain allows for use of a smaller loop filter bandwidth, which improves PLL loop stability. The smaller VCO gain also results in less jitter in the oscillator signal. The gain ratio m between the slow high-gain path and the fast low-gain path is fixed and well defined. This known relationship makes it easier to define other PLL loop parameters. In addition, external voltage references are not needed with the novel techniques.

The techniques described herein may be advantageously used for various low voltage applications. Low power supply voltages are commonly used for many electronics circuits to help reduce power consumption. Low power consumption is especially desirable for portable devices that are battery powered. However, the low supply voltages also limit the control voltage range, which makes the large VCO gain problem more pronounced. The techniques described herein can handle large VCO gain, which may be more severe in low voltage applications.

The techniques described herein may be used for various electronics circuits. The use of the techniques for a wireless communication device is described below.

Figure 6:
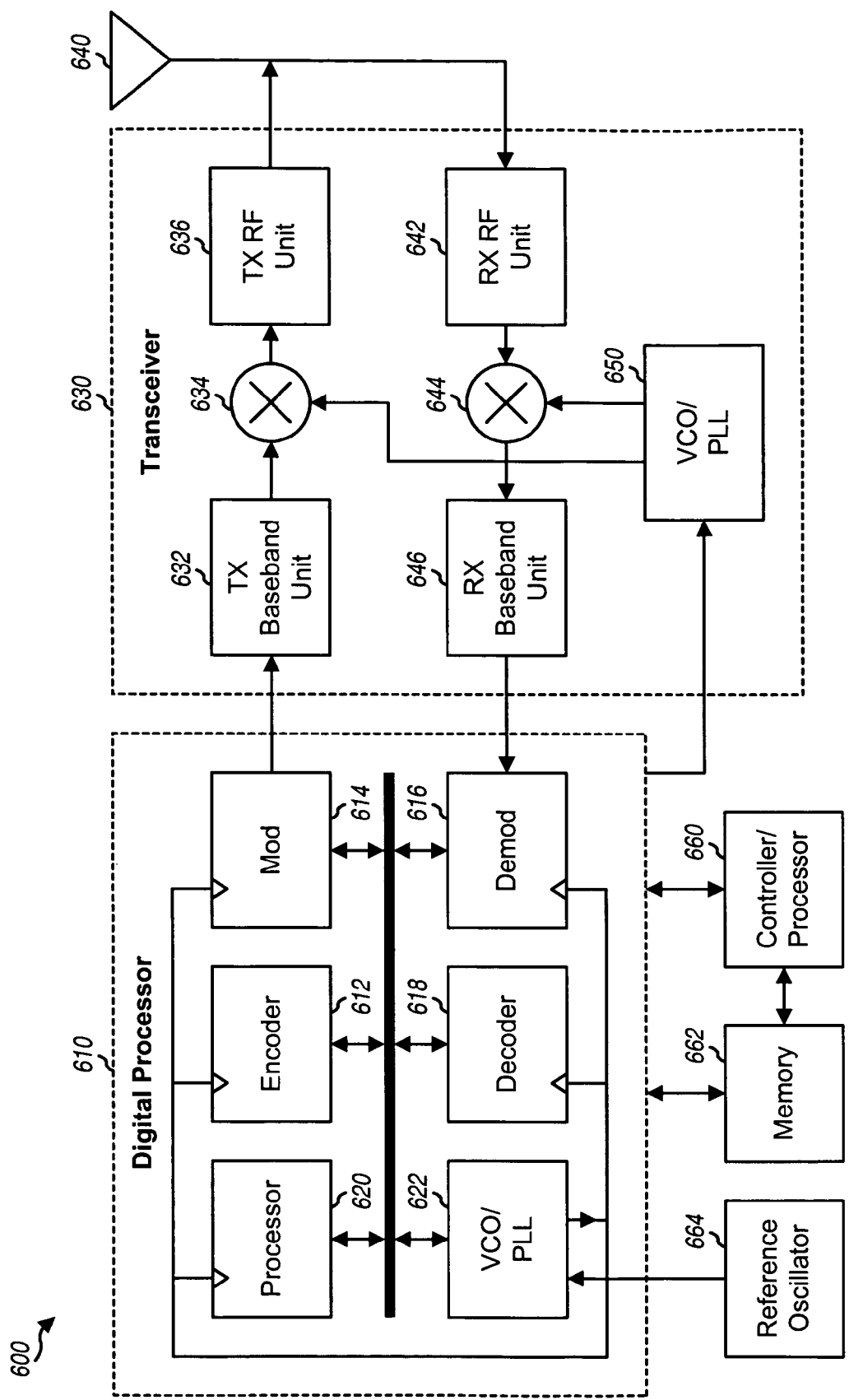
FIG. 6 shows a block diagram of a wireless device.

FIG. 6 shows a block diagram of an embodiment of a wireless device 600 in a wireless communication system. Wireless device 600 may be a cellular phone, a terminal, a PDA, a handset, or some other devices or designs. The wireless communication system may be a Code Division Multiple Access (CDMA) system, a Time Division Multiple Access (TDMA) system, a Frequency Division Multiple Access (FDMA) system, a Global System for Mobile Communications (GSM) system, an Orthogonal Frequency Division Multiple Access (OFDMA) system, and so on.

Wireless device 600 includes a digital processor 610 and a transceiver 630 that supports bi-directional communication. Digital processor 610 may be implemented with one or more application specific integrated circuits (ASICs), and transceiver 630 may be implemented with one or more RF integrated circuits (RFICs).

Within digital processor 610, an encoder 612 processes (e.g., formats, encodes, and interleaves) data to transmitted, and a modulator (Mod) 614 further processes (e.g., modulates and scrambles) the coded data to generate data chips. Within transceiver 630, a transmit (TX) baseband unit 632 performs baseband processing such as digital-to-analog conversion, filtering, amplification, and so on. A mixer 634 upconverts the baseband signal to RF. A TX RF unit 636 performs signal conditioning such as filtering and power amplification and generates an RF modulated signal, which is transmitted via an antenna 640. For data reception, a receive (RX) RF unit 642 receives an input RF signal from antenna 640 and performs signal conditioning such as low noise amplification and filtering. A mixer 644 downconverts the conditioned RF signal from RF to baseband. An RX baseband unit 646 performs baseband processing such as filtering, amplification, analog-to-digital conversion, and so on. A demodulator (Demod) 616 processes (e.g., descrambles and demodulates) the input samples from unit 646 and provides symbol estimates. A decoder 618 processes (e.g., deinterleaves and decodes) the symbol estimates and provides decoded data. In general, the processing by data processor 610 and transceiver 630 is dependent on the design of the wireless system.

A processor 620 may support various applications such as video, audio, graphics, and so on. A controller/processor 660 directs the operation of various processing units within wireless device 600. A memory 662 stores program codes and data for wireless device 600.

A VCO/PLL 622 generates clock signals for the processing units within digital processor 610. A VCO/PLL 650 generates a transmit LO signal used by mixer 634 for frequency upconversion and a receive LO signal used by mixer 644 for frequency downconversion. VCO 622 and/or VCO 650 may have large VCO gains and may utilize the techniques described herein. A current-mode dual-path voltage-to-current converter may be used for VCO 622 to split the VCO gain into two paths so that the average VCO frequency may be controlled with a slow high-gain path and the instantaneous VCO frequency may be adjusted with a fast low-gain path. A current-mode dual-path voltage-to-current converter may also be used for VCO 650. A reference oscillator 664 generates a reference signal for VCO/PLL 622 and/or VCO/PLL 650. Reference oscillator 664 may be a crystal oscillator (XO), voltage-controlled XO (VCXO), a temperature-compensated XO (TCXO), or some other type of oscillator.

The VCO and PLL described herein may be implemented in an analog IC, an RFIC, an ASIC, a digital signal processor (DSP), a digital signal processing device (DSPD), a programmable logic device (PLD), a field programmable gate array (FPGA), a processor, a controller, a micro-controller, a microprocessor, and other electronic units. The VCO and PLL may be implemented in various IC process technologies such as N-MOS, P-MOS, CMOS, BJT, GaAs, and so on. The VCO and PLL may also be implemented with discrete components.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An integrated circuit comprising:
a voltage-to-current converter configured to receive an analog control voltage and generate both a first current and a second current based on the analog control voltage, wherein the first current is equal to the second current;
a current amplifier configured to filter and amplify the first current with a gain greater than one and generate a third current;
a summer configured to sum the second current and the third current to generate a control current; and
a current-controlled oscillator (ICO) configured to receive the control current and generate an oscillator signal having a frequency determined by the control current.

2. The integrated circuit of claim 1, wherein the voltage-to-current converter is configured to generate the second current as a current mirror of the first current.

3. The integrated circuit of claim 1, wherein the current amplifier comprises a current mirror configured to receive the first current and provide the third current.

4. The integrated circuit of claim 3, wherein the current amplifier further comprises a capacitor configured to provide filtering for the first current.

5. The integrated circuit of claim 1, wherein the summer is formed by a summing node for outputs of the voltage-to-current converter and the current amplifier.

6. The integrated circuit of claim 1, wherein the voltage-to-current converter and the current amplifier are implemented with field effect transistors (FETs).

7. The integrated circuit of claim 1, further comprising:
a divider configured to divide the oscillator signal in frequency and provide a feedback signal;
a phase-frequency detector configured to compare phases of the feedback signal and a reference signal and provide a detector signal; and
a loop filter configured to filter the detector signal and provide the analog control voltage.

8. The integrated circuit of claim 7, wherein the loop filter has a first bandwidth and the current amplifier has a second bandwidth that is smaller than the first bandwidth.

9. The integrated circuit of claim 7, wherein the phase-frequency detector comprises
a charge pump configured to receive a digital phase error signal indicative of phase error between the feedback signal and the reference signal and to provide the detector signal.

10. The integrated circuit of claim 1, wherein the voltage-to-current converter comprises
a first transistor configured to receive the analog control voltage at a gate and provide the first current at a drain, and
a second transistor matched to the first transistor and configured to receive the analog control voltage at a gate and provide the second current at a drain.

11. The integrated circuit of claim 1, wherein the voltage-to-current converter has a bandwidth wider than a bandwidth of the analog control voltage.

12. The integrated circuit of claim 1, wherein the voltage-to-current converter is after a charge pump and a loop filter in a phase-locked loop.

13. The integrated circuit of claim 1, wherein the first current changes slower than the second current and in parallel with the second current.

14. A method comprising:
generating both a first current and a second current based on an analog control voltage, wherein the first current is equal to the second current;
filtering and amplifying the first current with a gain greater than one to generate a third current;
summing the second current and the third current to generate a control current; and
generating an oscillator signal having a frequency determined by the control current.

15. The method of claim 14, further comprising:
dividing the oscillator signal in frequency to generate a feedback signal;
comparing phases of the feedback signal and a reference signal to generate a detector signal; and
filtering the detector signal to generate the analog control voltage.

16. An apparatus comprising:
means for generating both a first current and a second current based on an analog control voltage, wherein the first current is equal to the second current;
means for filtering and amplifying the first current with a gain greater than one to generate a third current;
means for summing the second current and the third current to generate a control current; and
means for generating an oscillator signal having a frequency determined by the control current.

17. The apparatus of claim 16, further comprising:
means for dividing the oscillator signal in frequency to generate a feedback signal;
means for comparing phases of the feedback signal and a reference signal to generate a detector signal; and
means for filtering the detector signal to generate the analog control voltage.

18. An integrated circuit comprising:
a converter configured to receive an analog control voltage, to generate a first current based on the analog control voltage, to generate a second current via a fast low-gain path based on the analog control voltage, to filter and amplify the first current with a gain greater than one to generate a third current via a slow high-gain path, and to sum the third current and the second current to generate a control current, wherein the first current is equal to the second current; and
a current-controlled oscillator (ICO) configured to receive the control current and generate an oscillator signal having a frequency determined by the control current.

19. The integrated circuit of claim 18, wherein the slow high-gain path has a fixed gain factor of m relative to the fast low-gain path, where m is greater than one.

20. The integrated circuit of claim 18, further comprising:
a phase-locked loop configured to receive a reference signal and the oscillator signal and to generate the analog control voltage such that the frequency of the oscillator signal is locked to a frequency of the reference signal.

21. A wireless device comprising:
a converter configured to receive an analog control voltage, to generate a first current based on the analog control voltage, to generate a second current via a fast low-gain path based on the analog control voltage, to filter and amplify the first current with a gain greater than one to generate a third current via a slow high-gain path, and to sum the third current and the second current to generate a control current, wherein the first current is equal to the second current; and
a current-controlled oscillator (ICO) configured to receive the control current and generate an oscillator signal having a frequency determined by the control current.

22. The wireless device of claim 21, wherein the slow high-gain path has a fixed gain factor of m relative to the fast low-gain path, where m is greater than one.

23. The wireless device of claim 21, further comprising:
a phase-locked loop configured to receive a reference signal and the oscillator signal and to generate the analog control voltage such that the frequency of the oscillator signal is locked to a frequency of the reference signal.

24. The wireless device of claim 21, wherein the oscillator signal is used to generate clock signals for digital circuitry.

25. The wireless device of claim 21, wherein the oscillator signal is used for frequency upconversion in a transmitter or frequency downconversion in a receiver.

* * * * *